United States Patent
Nurmi

(10) Patent No.: US 6,639,145 B1
(45) Date of Patent: Oct. 28, 2003

(54) PROTECTING DEVICE AGAINST INTERFERING ELECTROMAGNETIC RADIATION COMPRISING EMI GASKETS

(75) Inventor: Reijo Nurmi, Kartanotie (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/009,987

(22) PCT Filed: Jun. 22, 2000

(86) PCT No.: PCT/FI00/00567

§ 371 (c)(1),
(2), (4) Date: Feb. 4, 2002

(87) PCT Pub. No.: WO01/01742

PCT Pub. Date: Jan. 4, 2001

(30) Foreign Application Priority Data

Jun. 24, 1999 (FI) .................................................. 991452

(51) Int. Cl.⁷ ................................................ H05K 9/00
(52) U.S. Cl. .................................................. 174/35 GC
(58) Field of Search .................... 174/35 GC, 35 R; 361/816, 818; 277/920

(56) References Cited

U.S. PATENT DOCUMENTS

| | | |
|---|---|---|
| 2,604,507 A | 6/1952 | Tyson |
| 3,011,775 A | 12/1961 | MacLeod |
| 3,502,784 A | 3/1970 | Kunkel |
| 3,904,810 A | 9/1975 | Kraus |
| 4,529,257 A | 7/1985 | Goodman et al. |
| 4,564,722 A | 1/1986 | Nordin |
| 4,572,921 A | 2/1986 | May et al. |
| 4,780,570 A | 10/1988 | Chuck |
| 4,788,381 A | 11/1988 | Nilsson |
| 4,794,206 A * | 12/1988 | Weinstein ............ 174/35 MS |
| 4,929,802 A | 5/1990 | Schaepers et al. |
| 5,029,254 A | 7/1991 | Stickney |
| 5,091,606 A | 2/1992 | Balsells ............ 174/35 |
| 5,134,244 A | 7/1992 | Balsells |
| 5,223,670 A | 6/1993 | Hogan et al. |
| 5,313,016 A | 5/1994 | Brusati et al. |
| 5,474,309 A | 12/1995 | Balsells |
| 5,502,784 A | 3/1996 | Rondeau |
| 5,545,843 A | 8/1996 | Arvidsson et al. |
| 5,581,048 A | 12/1996 | Shores |
| 5,603,514 A | 2/1997 | Jencks et al. |
| 5,770,822 A | 6/1998 | Abolitz et al. |
| 5,885,118 A | 3/1999 | Billenstein et al. |
| 5,959,244 A | 9/1999 | Mayer |
| 6,182,835 B1 | 2/2001 | Chen |

FOREIGN PATENT DOCUMENTS

| | | |
|---|---|---|
| CH | 668 527 | 10/1985 |
| DE | 1 849 258 | 4/1962 |
| DE | 197 01 690 | 7/1998 |
| EP | 0477 628 A1 | 9/1991 |
| EP | 0 889 686 | 6/1998 |
| GB | 1 505 579 | 3/1978 |
| GB | 2 222 913 A | 3/1990 |
| JP | 56-158202 | 12/1981 |
| JP | 10-173382 | 6/1998 |
| WO | WO 94/30035 | 12/1994 |

\* cited by examiner

Primary Examiner—Hung V. Ngo
(74) Attorney, Agent, or Firm—Cohen, Pontani, Lieberman & Pavane

(57) ABSTRACT

The object of the invention is a device cabinet and particularly a solution for its EMI sealing (electromagnetic interference). The device cabinet comprises a first part (20) and a second part (21), which comprise a first joint surface (25) and a second joint surface (22) respectively, in a space between the joint surfaces there being an EMI gasket (24) made from a conductive wire for getting the joint surfaces (22, 25) into contact and for preventing electromagnetic interference from penetrating the joining point between the first and second parts (20, 21). It is characteristic of the invention that said EMI gasket (24) is arranged to cause friction against the joint surfaces (22, 25) for preventing and eliminating contact failures caused by the oxidisation of the joint surfaces (22, 25).

17 Claims, 4 Drawing Sheets

PROTECTING DEVICE AGAINST INTERFERING ELECTROMAGNETIC RADIATION COMPRISING EMI GASKETS

FIELD OF THE INVENTION

PRIORITY CLAIM

This is a national stage of PCT application No. PCT/FI00/00567, filed on Jun. 22, 2000. Priority is claimed on that application, and on patent application Ser. No. 991452 filed in Finland on Jun. 24, 1999.

BACKGROUND OF THE INVENTION

Electromagnetic radiation generated in a device may disturb either the device's own operation or the operation of some external device. Generally, the aim is to protect sensitive devices and interfering sources of electromagnetic radiation against radiation by encasing them in packages made from a conductive material and by sealing the packages so tight that no interfering electromagnetic radiation can penetrate the package. This type of or similar protection of devices against electromagnetic radiation is called EMI (electromagnetic interference) shielding.

One problematic area in EMI shielding is the sealing of junctions and joint surfaces comprised by devices, device cabinets and boxes. If the joint surfaces are not properly sealed with EMI gaskets, interfering electromagnetic radiation will quite easily pass through the joint. The best protection against interference is achieved when the joint surfaces are tightly sealed together galvanically. This means that resistance between the joint surfaces, so-called 'junction resistance', is as low as possible. However, it is difficult and expensive to manufacture such plane-like joint surfaces, where the surfaces are tightly attached to each other in every place galvanically. Therefore, solutions in which a good contact between the joint surfaces is not formed in every place but at certain distances along the whole length of the joint, are used for sealing joint surfaces. When the distance between the contacts formed is sufficiently short, electromagnetic radiation can no longer penetrate the joint in disturbing quantities. A sufficient contact distance depends on the frequency of the interfering radiation and the required attenuation level. Mechanical properties and the available space also affect the contact distance used. In connection with device cabinets and racks, a typical contact distance can be, e.g. 5–15 mm.

EMI sealing is required in various types of electric devices. Among others, EMI gaskets are used in device box and cabinet doors and apertures, as well as in partitions between different units inside device cabinets.

There are at least three types of gaskets that are most commonly used for EMI sealing. In one solution, a mantle is knitted from a conductive material around a resilient rubber compound or some other corresponding material. The mantle is knitted from a very thin wire that acts as a conductive fabric. When placed in between joint surfaces, these types of gaskets give an even contact but do not necessarily give a sufficient contact for EMI shielding due to the large contact area. They do not pierce through the surface, which is slightly oxidised or greasy. These types of gaskets may shed short pieces of wire, which can cause a short circuit after being passed on to a printed board. Neither do they endure friction and continuous wear.

In a second solution conductive particles are mixed inside a rubber-like sealing compound, the conductive particles forming a galvanic connection between joint surfaces when the joint surfaces are pressed together. However, the electroconductivity of these types of gaskets does not come near to that of, e.g. copper alloyed gaskets. Furthermore, the properties of these types of gaskets may change as they age.

A third solution is provided by spring-like gaskets bent from sheet metal. Their electroconductivity is good, but their manufacture is problematic. The manufacture of spring-like sheet metal gaskets requires expensive perforating and bending tools. In addition, the edges of the gaskets are sharp, whereupon one may hurt one's hand on them, and the length of the gaskets is limited to the length of the sheet used in their manufacture, which normally is about 70 cm, in which case a full-length gasket must be assembled from several pieces.

The most significant disadvantage of a spring-like sheet metal gasket is, however, its susceptibility to being damaged due to its poor elastic properties. The gasket has extremely accurate tolerance of compression. If joint surfaces are pressed together too little, the gasket placed in between them will leak, as it is called, i.e. let electromagnetic radiation significantly through it. If again joint surfaces are pressed too much, a permanent deformation will take place in the gasket and its compression force will no longer be sufficient. Also in this case, the joint will begin to leak.

FIG. 1 illustrates an EMI gasket, presented in the Patent Publication U.S. Pat. No. 5,091,606, which comprises a helical spring 10 made from circular profiled wire and it may comprise a layer 11 made from a conductive and ductile material and placed on top of the spring. When this type of gasket is placed between the surfaces to be sealed and the surfaces are pressed against each other, a contact is formed between the surfaces. The gasket is intended for sealing shafts and other surfaces with a round cross-sectional surface, and their surrounding areas. A disadvantage of these types of gaskets is a reasonably complex manufacturing process, as well as the difficulty of fitting the gasket into small spaces.

Typically, the surfaces to be sealed are made from oxidable materials, such as sheet metal, in which case when the surfaces oxidise the contact between the surfaces becomes weaker and EMI tightness will be lost. The contact also becomes weaker when dirt gets between the gasket and the surfaces to be sealed.

SUMMARY OF THE INVENTION

Now, EMI sealing has been invented with the help of which the disadvantages presented above can be mitigated. This is achieved with the help of a device, which comprises a first part and a second part, joined together, which comprise a first joint surface and a second joint surface respectively, and in between the joint surfaces an EMI gasket made from conductive wire for getting the joint surfaces into contact and for preventing electromagnetic interference from penetrating the joining point between the first and second parts, the device being characterised in that said EMI gasket is arranged to cause friction against the joint surfaces for preventing and eliminating contact failures.

According to the invention, an EMI gasket is made from a spring-like, electroconductive wire by bending this in the appropriate shape depending on the use, e.g. in the shape of a helical spring. The EMI gasket according to the invention is in direct contact with the surfaces to be sealed. The gasket forms reliable contacts between the surfaces to be sealed and directs friction on to the surfaces when the device is opened and closed removing by its friction the oxide layer and impurities possibly produced on the contact surfaces. This being the case, the contact between the surfaces to be sealed remains good and electromagnetic radiation cannot penetrate the joint in disturbing quantities, whereupon EMI tightness will be maintained.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the following, the invention will be explained in detail by referring to the enclosed drawings, in which.

DETAILED DESCRIPTION OF THE PRESENTLY PREFERRED EMBODIMENTS

Figure 1:
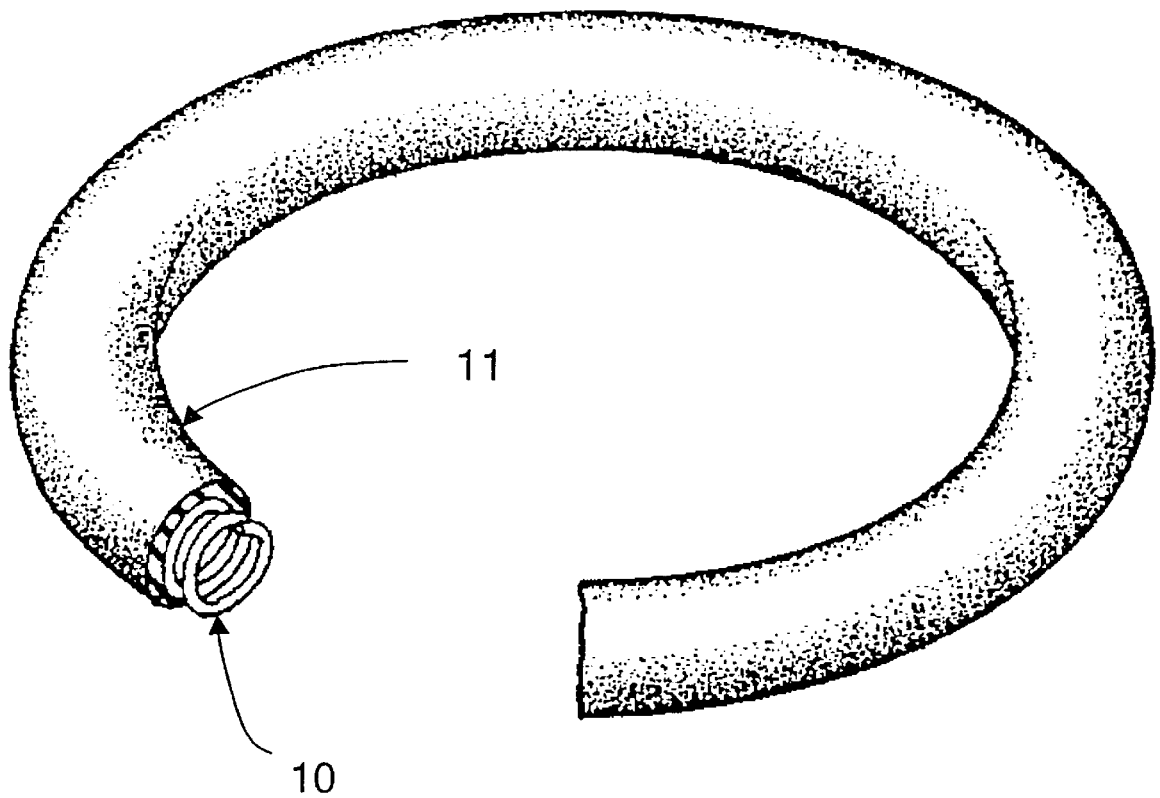
FIG. 1 shows an EMI gasket according to prior art.
Figure 2A:
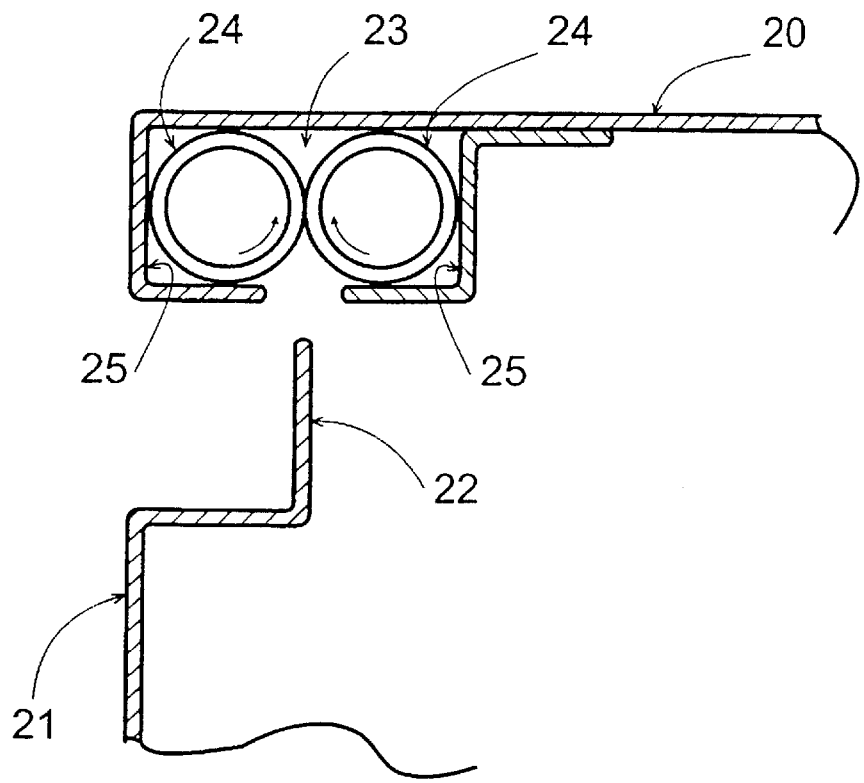
FIGS. 2a–2b show one way of EMI sealing according to the invention.
Figure 2B:
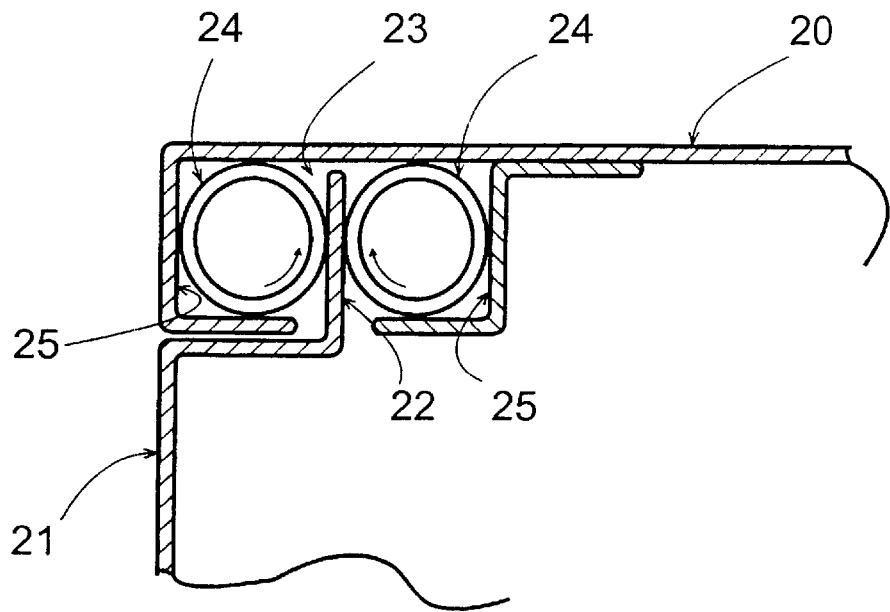

FIG. 1 was described above in connection with the description of prior art. FIGS. 2a and 2b are related to a first embodiment according to the invention, in which the door of a device rack is sealed with EMI gaskets according to the invention. The method is also suitable for use in connection with device boxes and cabinets. Said device rack can be, e.g. one of the device racks of a base transceiver station of a mobile communication network, which comprises a door 20 and a frame part 21 made, e.g. from an electroconductive material, such as sheet metal. The frame 21 of the device rack comprises a tongue-like part 22 and the door 20 in turn a hollow space 23 into which the tongue-like part 22 of the frame 21 can penetrate when the door 20 is closed. The penetration of interfering electromagnetic radiation from inside the device rack to outside the device rack and from outside the rack to inside the rack is prevented by placing two EMI gaskets 24 according to the invention in the hollow space 23 of said door 20 of the rack, and by closing the door.

In this context, by the door 20 is meant any sheet-like part that is intended for covering a hole comprised by the frame part 21 of some device rack. Normally, the gaskets 24 encircle the whole joint surface. Thus, the way presented here can be used for sealing all joints between the door 20 and the frame part 21 of the device rack. However, in the following, this paper will focus on explaining the sealing of only one edge of the door.

FIG. 2a illustrates a situation, where the door 20 of the device rack is open. Two EMI gaskets 24 are placed in the hollow space 23 of the door. The EMI gaskets 24 used can be made by bending the sealing wire in different shapes, e.g. in the shape of a polygon, but in this embodiment the sealing wire is preferably bent in the shape of a helical spring. Said hollow space 23 preferably has a rectangular cross-section, where the length of the shorter sides is half the length of the longer sides. This being the case, when the door 20 is open, the two EMI gaskets 24 placed in the hollow space 23 touch surfaces 22, 25 that surround them. Furthermore, the EMI gaskets 24 are preferably wound in the opposite directions, whereupon they will not significantly penetrate into each other when the door 20 is open.

The gaskets 24 can be made from several different materials, e.g. from alloyed copper metal, stainless steel or other corresponding material. The gasket's electrical and mechanical properties, as well as manufacturability can be affected by the selection of the sealing material. The diameter of the wire used for the manufacture of the gasket 24 may vary, but it is typically approximately 0.5–3 mm. The diameter of the gasket can be, e.g. 2–40 mm. The sealing wire is bent in the required shape by a spring-making machine designed for bending wire material.

FIG. 2b illustrates a situation when the door 20 of the device rack is closed. When closing the device rack door, the tongue-like part 22 of the frame part 21 of the rack is pressed between the EMI gaskets 24, whereupon both gaskets 24 are pressed against the surrounding surfaces 22, 25 of the door 20 and the frame part 21 of the device rack. The gaskets 24 compress in the directions that are perpendicular to the axis that runs in the longitudinal direction inside the gasket. The elastic forces that act in the compressed gasket 24 tend to return the gasket into its original shape, whereupon the gasket 24 presses tightly against the joint surfaces 22, 25 forming good contacts between the joint surfaces 22, 25 at close distances and preventing electromagnetic radiation from penetrating the joint. The distance between two adjacent contacts, which is the same as the pitch of thread, is typically approximately 10–15 mm. As a result, good EMI tightness is achieved. The EMI tightness will not be lost even if the door 20 was slightly open, if the tongue-like part 22 of the device rack frame 21 still reaches as far as between the gaskets 24.

The device cabinet door 20 sealed in the way presented here is light to close, because the gaskets 24 swing round as the tongue-like part 22 that belongs to the frame 21 penetrates in between the gaskets 24. Neither does the structure demand external mechanisms for keeping the door 20 closed, because the forces that act in the gaskets 24 do not tend to open the door. The structure also has the advantage that, in this case, there are more than two joint surfaces 25 (surfaces 25 on both sides of the tongue-like part 22). This increases the EMI sealing ability.

The advantages of the first embodiment according to the invention relate to friction between the gasket 24 and the surfaces 22, 25 surrounding it. The friction is particularly effective, because the helical spring-like gasket 24 is preferably at close distances in direct contact with the surfaces 22, 25 to be sealed. This being the case, always when the door 20 moves, e.g. when the door is open and closed, the threads of the helical spring 24 rub heavily on the joint surfaces 22, 25 keeping the joint surfaces clean and removing the oxide layer possibly produced on them that conduct poorly electricity and weaken the contact. The gasket 24 pressed tightly against the surfaces 22, 25 to be sealed also prevents the oxidisation of the surfaces to be sealed at the points of the contacts, whereupon the contact between the surfaces 22, 25 to be sealed remains sharp.

In the first embodiment according to the invention, a gasket made by inclining the pitch of thread in the same direction along the whole length of the helical spring-like gasket can also be used as an EMI gasket. The cross-section of the inclined helical spring-like gasket is in the shape of an ellipse so that it fits in the hollow space comprised by the device rack door, the dimensions of which differ from those presented above.

In an alternative implementation of the first embodiment according to the invention, the tongue-like part can be on the door and the hollow space, wherein the gasket is installed, in the frame respectively.

If there is a desire to make the gasket 24 ready in the desired shape, a rigid support wire placed inside the gasket can be utilised in bending the gasket. The support wire is first bent in the desired shape, e.g. in the shape of the edge of the device rack, after which the gasket 24 is slipped on to the support wire. Finally, the gasket together with the support wire is placed in the space 23 reserved for it.

Figure 3A:
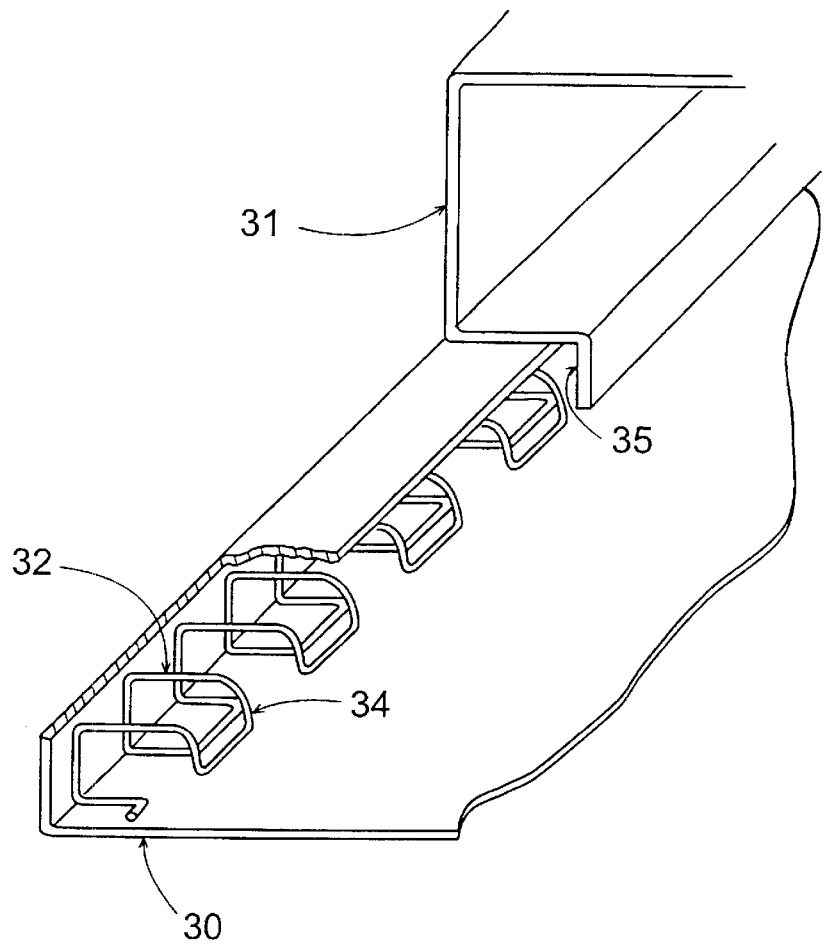
FIGS. 3a–3d show another way of EMI sealing according to the invention.
Figure 3B:
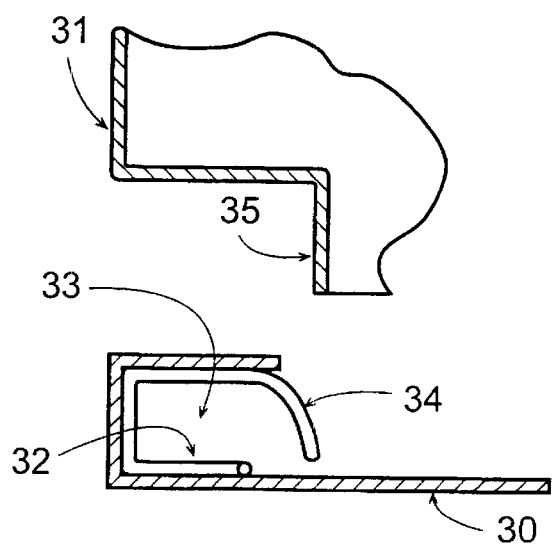
Figure 3C:
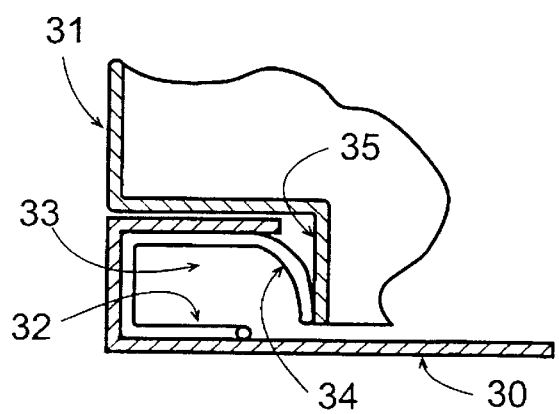

FIGS. 3a–3c illustrate a second embodiment according to the invention. In this embodiment, the joint between a first mechanical part 30 and a second mechanical part 31 is EMI sealed. Said mechanical parts 30, 31 can be, e.g. parts of a device cabinet or rack, one of which is preferably a door. An EMI gasket 32 is preferably bent to make a periodic, spring-like structure so that along a specific length the spring comprises two parallel parts that are perpendicular to the longitudinal axis of the spring and in between them a part that is parallel to the longitudinal direction of the spring. The longitudinal part does not have to be on the same plane as the above-mentioned parallel parts, but it can be in contact with these through two curved parts, whereupon the curved parts together with the longitudinal part form a nose-like part 34.

Preferably, said first mechanical part 30 comprises a recess 33 into which the EMI gasket 32 can be pushed so that it remains compressed against the edges of the recess 33. The nose-like part 34 of the EMI gasket reaches out of the recess 33 for forming a contact between a surface 35 of said second part 31 and the edges of the recess 33 of the first part 30. In the second embodiment according to the invention, longer contacts are achieved between the gasket 32 and the joint surface 35 than in the first embodiment of the invention, in which a helical spring-like gasket was used, because now the contacts are formed through longitudinal parts of the EMI gasket 32.

FIGS. 3b–3c illustrate situations, where said first and second parts are separate from each other (FIG. 3b) and joined together (FIG. 3c). Friction between the gasket 32 and said second part 31 occurs always when the first part 30 moves, e.g. said first part being a door, when the door is opened and closed. With the friction, the same advantages are achieved as presented in connection with the first embodiment according to the invention.

Figure 3D:
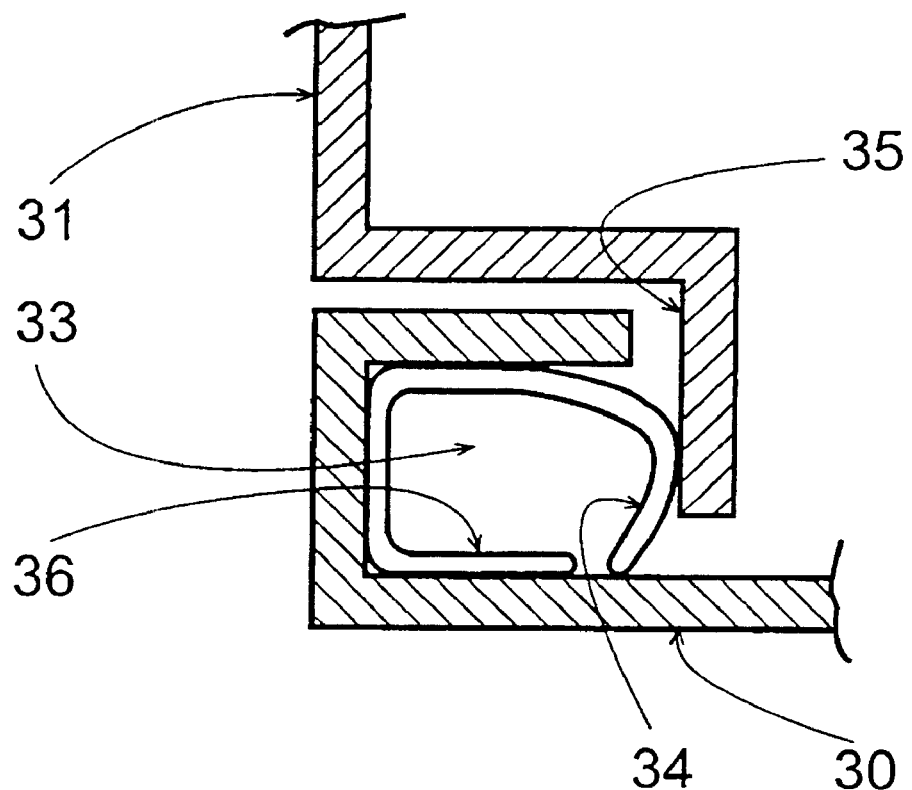

The nose-like part 34 of an EMI gasket 36 (FIG. 3d) can also be shaped so that two curved parts, which are parallel to each other and perpendicular to the longitudinal axis of the gasket, form a final contact with the joint surface 35 of said second part 31. In this case, the longitudinal part of the spring can be used to limit the motion of the spring against said first part 30.

This paper presents the implementation and embodiments of the invention with the help of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims, and the various options of implementing the invention as determined by the claims, including the equivalent implementations, also belong to the scope of the invention.

What is claimed is:

1. An apparatus to protect the contents thereof against electromagnetic radiation comprising:
   a first part comprising a recess;
   a second part comprising a tongue-shaped portion, the first and second parts being movably connected to one another and shaped so as to form an enclosed space when the first and second parts are in a closed orientation, the tongue-shaped portion of the second part being in close proximity to the recess of the first part when the first and second parts are in the closed orientation; and
   two EMI (electromagnetic interference) gaskets, each formed from a electrically-conductive wire having an elongated, periodically repeating shape, the two EMI gaskets being mounted in the recess of the first part and being shaped so that, when the first and second parts are in the closed orientation, the tongue-shaped portion of the second part is positioned in between the two EMI gaskets to make electronic contact with both EMI gaskets.

2. The apparatus according to claim 1, wherein the first part is the door of a device rack and the second part is the frame of the device rack.

3. The apparatus according to claim 2, wherein the EMI gaskets are made from electrically conductive wire, helical in shape.

4. The apparatus according to claim 3, wherein the EMI gaskets are wound in opposite directions.

5. The apparatus according to claim 2, wherein the EMI gaskets make frictional contact with the tongue-shaped portion of the second part when the first and second parts are in the closed orientation.

6. The apparatus according to claim 2, wherein each EMI gasket has a polygon shape perpendicular to a longitudinal axis of the EMI gasket.

7. The apparatus according to claim 1, wherein the EMI gaskets are made from electrically conductive wire, helical in shape.

8. The apparatus according to claim 7, wherein the EMI gaskets are wound in opposite directions.

9. The apparatus according to claim 8, wherein the EMI gaskets make frictional contact with the tongue-shaped portion of the second part when the first and second parts are in the closed orientation.

10. The apparatus according to claim 7, wherein the EMI gaskets make frictional contact with the tongue-shaped portion of the second part when the first and second parts are in the closed orientation.

11. The apparatus according to claim 7, wherein each EMI gasket has a polygon shape perpendicular to a longitudinal axis of the EMI gasket.

12. The apparatus according to claim 1, wherein the EMI gaskets make frictional contact with the tongue-shaped portion of the second part when the first and second parts are in the closed orientation.

13. The apparatus according to claim 1, wherein each EMI gasket has a polygon shape perpendicular to a longitudinal axis of the EMI gaskets.

14. The apparatus according to claim 13, wherein the EMI gaskets make frictional contact with the tongue-shaped portion of the second part when the first and second parts are in the closed orientation.

15. The apparatus according to claim 13, wherein the EMI gaskets are made from electrically conductive wire, helical in shape.

16. The apparatus according to claim 15, wherein the EMI gaskets are wound in opposite directions.

17. The apparatus according to claim 1, wherein each EMI, gasket comprises, along a longitudinal axis of the EMI gasket, two parallel parts that are perpendicular to the longitudinal axis of the gasket and, in between them, a part that is parallel to the longitudinal axis of the gasket.

* * * * *